US007340727B2

(12) United States Patent
Bailwal

(10) Patent No.: US 7,340,727 B2
(45) Date of Patent: Mar. 4, 2008

(54) VERILOG TO C++ LANGUAGE TRANSLATOR

(75) Inventor: Ghanashyam A Bailwal, Bangalore (IN)

(73) Assignee: Broadcom Corporation, Irvine, CA (US)

(*) Notice: Subject to any disclaimer, the term of this patent is extended or adjusted under 35 U.S.C. 154(b) by 663 days.

(21) Appl. No.: 10/765,631

(22) Filed: Jan. 27, 2004

(65) Prior Publication Data

US 2005/0166165 A1 Jul. 28, 2005

(51) Int. Cl.
*G06F 9/45* (2006.01)
*G06F 17/50* (2006.01)

(52) U.S. Cl. .......................... 717/136; 716/3
(58) Field of Classification Search ............... None
See application file for complete search history.

(56) References Cited

U.S. PATENT DOCUMENTS

| 6,053,947 A * | 4/2000 | Parson ........................ 703/14 |
| 6,996,788 B2 * | 2/2006 | Akiba et al. ................... 716/3 |
| 2002/0083420 A1 * | 6/2002 | Zammit et al. ............. 717/135 |
| 2003/0061580 A1 * | 3/2003 | Greaves ......................... 716/4 |
| 2003/0074640 A1 * | 4/2003 | Mandell et al. ................ 716/3 |
| 2003/0154465 A1 * | 8/2003 | Bollano et al. ............. 717/137 |

OTHER PUBLICATIONS

Greaves, DJ; "A Verilog to C Compiler", 2000 IEEE, retrieved Mar. 10, 2007.*
Panda, Preeti Ranjan; "SystemC—A modeling platform supporting multiple design astractions", p. 75-80, ACM 2001,retrieved Mar. 9, 2007.*
Richards, Neil; Green, James; Stoye, William; Greaves, David; "C Models Speed Co-Design", Dec. / Jan. 2004, Chip Design Magazine, retrieved from google.com Mar. 10, 2007.*
Stoye, William; Greaves, David; Righards, Neil; Green, James; "Using RTL to C++ Translation forLarge SOC Concurrent Engineering: A Case Study", Electronics Systems and Software Feb. 2003, p. 20-25, retrieved form google.com Mar. 10, 2007.*

* cited by examiner

*Primary Examiner*—Mary Steelman
(74) *Attorney, Agent, or Firm*—McAndrews Held & Malloy, Ltd.

(57) ABSTRACT

Method and system for translating Verilog to C++ are provided herein. Aspects of the method for translating may include searching for a Verilog pattern in a Verilog file and substituting the Verilog pattern with a C++ language expression, wherein the C++ language expression is associated with the same functionality as the Verilog pattern. It may be identified whether the Verilog file comprises at least one of a task library, a main driver, and a driver module. If the Verilog file comprises a task library, a Verilog task within the task library may be identified; and the Verilog task may be translated into a C++ function. If the Verilog file comprises a main driver, a C++ interface header may be inserted in the Verilog file.

32 Claims, 5 Drawing Sheets

| VERILOG PATTERN | C++ PATTERN / ACTION |
|---|---|
| # Delay Statements | Remove # Delay Statements |
| `idef Statements | Translate `idef Statements |
| ' Symbols | Remove ' Symbols |
| Begin | { |
| End | } |
| Register Definitions | Convert Register Definitons |
| Combinatorial Assignments | Convert Combinatorial Assignments |
| Events | Convert Events |
| Verilog Switches | Convert Verilog Switches |
| Verilog Concat Expressions | Convert Verilog Concat Expressions |
| Verilog Parameters | Convert to C++ #Defines |
| Verilog Consts | Convert to C Consts |
| Verilog Bit Access Macro | Convert Bit Access Macro |

FIG. 3

VERILOG TO C++ LANGUAGE TRANSLATOR

CROSS-REFERENCE TO RELATED APPLICATIONS/INCORPORATION BY REFERENCE

[Not Applicable]

FEDERALLY SPONSORED RESEARCH OR DEVELOPMENT

[Not Applicable]

SEQUENCE LISTING

[Not Applicable]

MICROFICHE/COPYRIGHT REFERENCE

[Not Applicable]

BACKGROUND OF THE INVENTION

Simulation programs are frequently used for testing integrated circuits. Integrated circuit production is characterized by high initial costs for the production of the first "copy" followed by low marginal costs for each successive copy. Testing of a design for an integrated circuit prior to production is almost imperative. There are major challenges in the area of functional verification of System-on-a-chip (SOC) design. Functional verification of the SOC design is necessary in order to verify that the integrated circuit functions are as expected and as designed. However, the design itself also needs to be tested for functional correctness. Currently, the SOC designs are implemented in High Level Hardware Specification languages such as Verilog. Verilog is a programming language defined by Open Verilog International (OVI) Corporation and now an Institute of Electrical and Electronic Engineers (IEEE) standard (IEEE-1364). The test benches for the SOC designs are also written in Verilog and are tested on Verilog simulation software.

In a conventional environment for functional verification of a system-on-a-chip design, a circuit design may be written in a hardware high level specification language, such as Verilog. The circuit design may be a very large design and may need to be tested on an emulator. The emulator may be utilized for design verification and validation since it is faster than a simulation software. The emulator may be interfaced to a host microprocessor. The test benches associated with the functional verification process performed by the emulator are often written in a language used for development of host software, such as C/C++. If the circuit design is written in a hardware high level specification language, such as Verilog, the test bench, associated with the circuit design may also be written in Verilog. However, to use the test bench with the emulator and the host microprocessor, the test bench may need to be written in C++.

It may be difficult and time consuming for the development of test benches written in both Verilog and C++. It may also be similarly difficult and time consuming for a test bench to be re-written from Verilog to C++. Another drawback is that it is difficult to maintain synchronization between the Verilog and C++ drivers as either one of them changes. As a result, both types of drivers, over a period of time, may diverge and create confusion in test bench development.

Further limitations and disadvantages of conventional and traditional approaches will become apparent to one of skill in the art, through comparison of such systems with some aspects of the present invention as set forth in the remainder of the present application with reference to the drawings.

BRIEF SUMMARY OF THE INVENTION

Certain aspects of the invention may be found in a method and system for translating Verilog to C++. The method for translating may include searching for a Verilog pattern in a Verilog file and substituting the Verilog pattern with a C++ language expression, wherein the C++ language expression is associated with the same functionality as the Verilog pattern. It may be identified whether the Verilog file comprises at least one of a task library, a main driver, and a driver module. If the Verilog file comprises a task library, a Verilog task within the task library may be identified; and the Verilog task may be translated into a C++ function. If the Verilog file comprises a main driver, a C++ interface header may be inserted in the Verilog file. Any # delay statements may be removed from the Verilog file. ifdef statements in the Verilog file may be translated. symbols may be removed from the Verilog file. Any "begin" keyword in the Verilog file may be converted to a "{" symbol. Any "end" keyword in the Verilog file may be converted to a "}" symbol. Register definitions in the Verilog file may be converted into at least one C++ definition. Combinatorial assignments may be performed in the Verilog file. Any event in the Verilog file may be converted into a C++ event. Any Verilog switch in the Verilog file may be converted into at least one C++ switch. Any Verilog concat expressions in the Verilog file may be converted into C++ concat expressions. Any Verilog parameter in the Verilog file may be converted into a C++ #define. Any Verilog constant in the Verilog file may be converted into a C++ constant. Any Verilog bit access macro in the Verilog file may be converted into a C++ functional equivalent.

Another embodiment of the invention provides, a machine-readable storage, having stored thereon a computer program having at least one code section, the at least one code section executable by a machine for causing the machine to perform the steps as described above.

These and other advantages, aspects and novel features of the present invention, as well as details of an illustrated embodiment thereof, will be more fully understood from the following description and drawings.

BRIEF DESCRIPTION OF SEVERAL VIEWS OF THE DRAWINGS

FIG. 3 is a Verilog/C++ pattern table utilized in accordance with an embodiment of the present invention.

DETAILED DESCRIPTION OF THE INVENTION

Certain aspects of the invention may be found in a method and system for translating Verilog to C++. The method for translating may include searching for a Verilog pattern in a Verilog file and substituting the Verilog pattern with a C++ language expression, wherein the C++ language expression is associated with the same functionality as the Verilog pattern. It may be identified whether the Verilog file comprises at least one of a task library, a main driver, and a driver module. If the Verilog file comprises a task library, a Verilog task within the task library may be identified; and the Verilog task may be translated into a C++ function. If the Verilog file comprises a main driver, a C++ interface header may be inserted in the Verilog file. Any # delay statements may be removed from the Verilog file. ifdef statements in the Verilog file may be translated. symbols may be removed from the Verilog file. Any "begin" keyword in the Verilog file may be converted to a "{" symbol. Any "end" keyword in the Verilog file may be converted to a "}" symbol. Register definitions in the Verilog file may be converted into at least one C++ definition. Combinatorial assignments may be performed in the Verilog file. Any event in the Verilog file may be converted into a C++ event. Any Verilog switch in the Verilog file may be converted into at least one C++ switch. Any Verilog concat expressions in the Verilog file may be converted into C++ concat expressions. Any Verilog parameter in the Verilog file may be converted into a C++ #define. Any Verilog const in the Verilog file may be converted into a C++ const. Any Verilog bit access macro in the Verilog file may be converted into a C++ functional equivalent.

Figure 1:
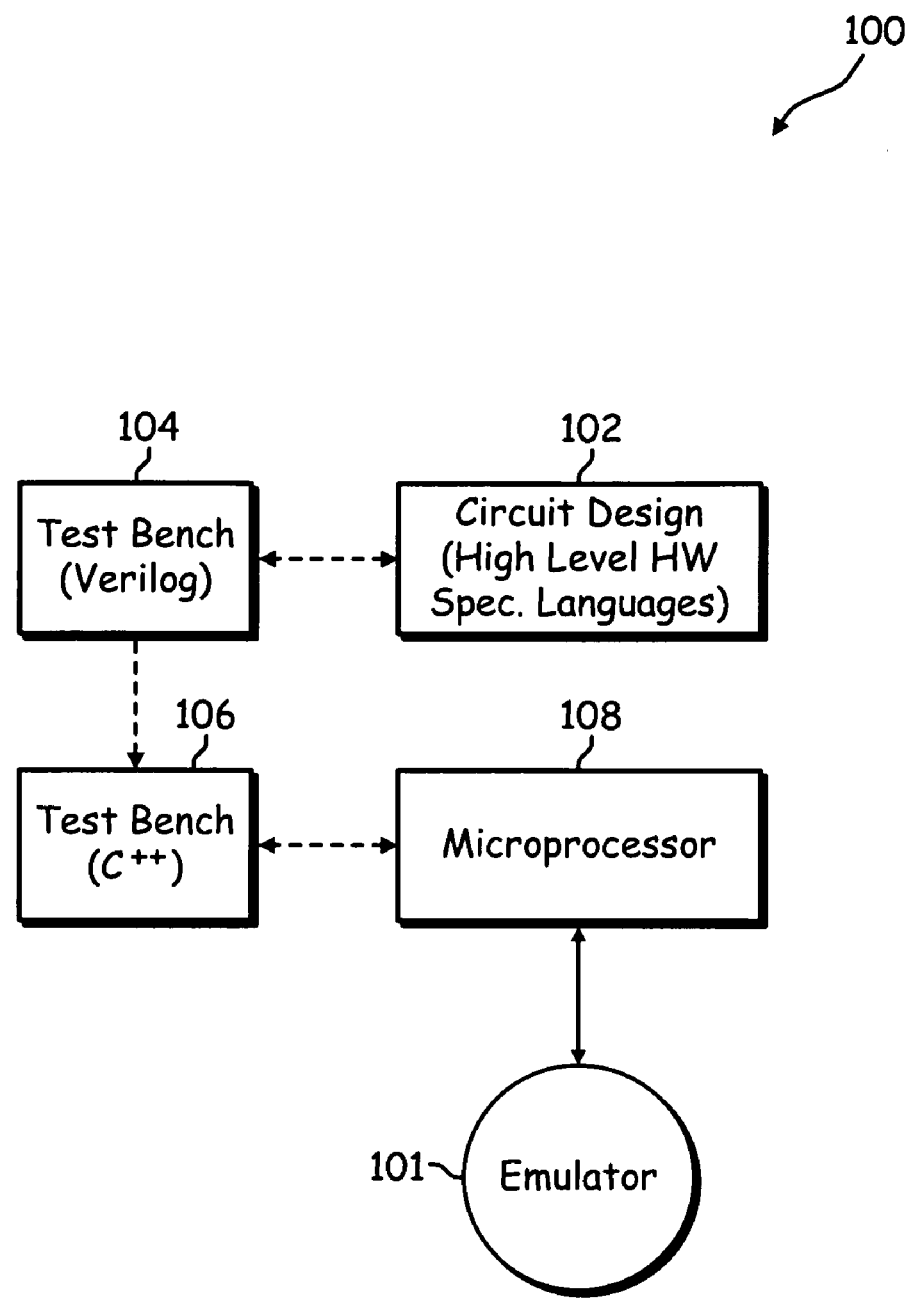
FIG. 1 is a block diagram illustrating a conventional system for functional verification of a system-on-a-chip design utilizing Verilog and C++ test benches.

Referring now to FIG. 1, there is illustrated an exemplary environment for the functional verification of a system-on-a-chip design, wherein the present invention can be practiced. The foregoing includes an emulator 101, a circuit design 102, a Verilog test bench 104, a C++ test bench 106 and a host processor 108. The circuit design 102 may be written in a hardware high level specification language, such as Verilog. The circuit design 102 may be a very large design and may need to be tested on an emulator 101. The emulator 101 may be utilized for design verification and validation since it is faster than a simulation software. The test benches 106 associated with the functional verification process performed by the emulator 101 are often written in a language used for development of host software at the host processor 108, such as C/C++. If the circuit design 102 is written in a hardware high level specification language, such as Verilog, the test bench 104 associated with the circuit design is also likely to be written in Verilog.

To use the test bench with the emulator 101 and the host processor 108, the test bench 104 in Verilog is converted to C++ test bench 106. The test bench 104 in Verilog can be converted to a test bench 106 in C++ by means of a translator as described below.

Figure 2:
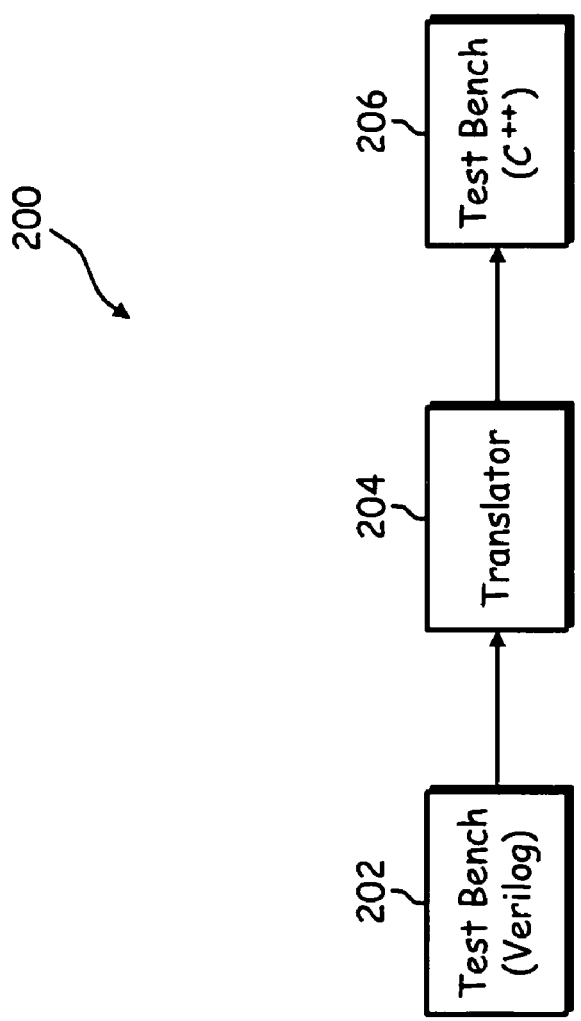
FIG. 2 is a block diagram of an exemplary system for translating Verilog to C++, in accordance with an embodiment of the present invention.

Referring now to FIG. 2, there is illustrated a block diagram of an exemplary system 200 for translating Verilog to C++, in accordance with an embodiment of the present invention. The system 200 may comprise a Verilog test bench 202, a translator 204, and a C++ test bench 206. The Verilog test bench 202 may be associated with the functional verification of a specific circuit design. The translator 204 may be a suitable logic, circuitry and/or code that may be realized in a VBScript environment utilizing VBScript code. The translator 204 may have the functionality to convert a test bench written in Verilog, such as the Verilog test bench 202, into a test bench written in C++, such as the test bench 206. This conversion may be realized on either emulation or chip hardware platforms. The resultant C++ test bench 206, utilizing the converted Verilog code, may be written in C++ in its entirety. In this way, the C++ test bench 206 may be easily compiled into a working executable.

Referring now to FIG. 3, there is illustrated a Verilog/C++ pattern table, which may be utilized in accordance with an embodiment of the present invention. Referring now to FIG. 2 and FIG. 3, the translator 204 may be written in a VBScript code, as a set of macro functions in VBScript for Microsoft Visual Studio, and may utilize a "find and replace" technique. More specifically, the translator 204 may search in the Verilog test bench 202 for a specific pattern and substitute the pattern with an equivalent C++ language expression or action. Sample Verilog patterns, and their equivalent C++ patterns or actions, are illustrated on FIG. 3.

The VBScript macros that may be utilized in the Verilog to C++ translator 204 of FIG. 2, may convert a particular Verilog syntactic structure in the Verilog domain and may translate it into the equivalent C++ syntactic structure in one step. This process may be repeated for all other syntactic structure types (for example the entries on the table of FIG. 3) one step at a time. The document that may be used for the translation process may be the currently open and active document of C++ type in Microsoft Visual Studio.

Figure 4:
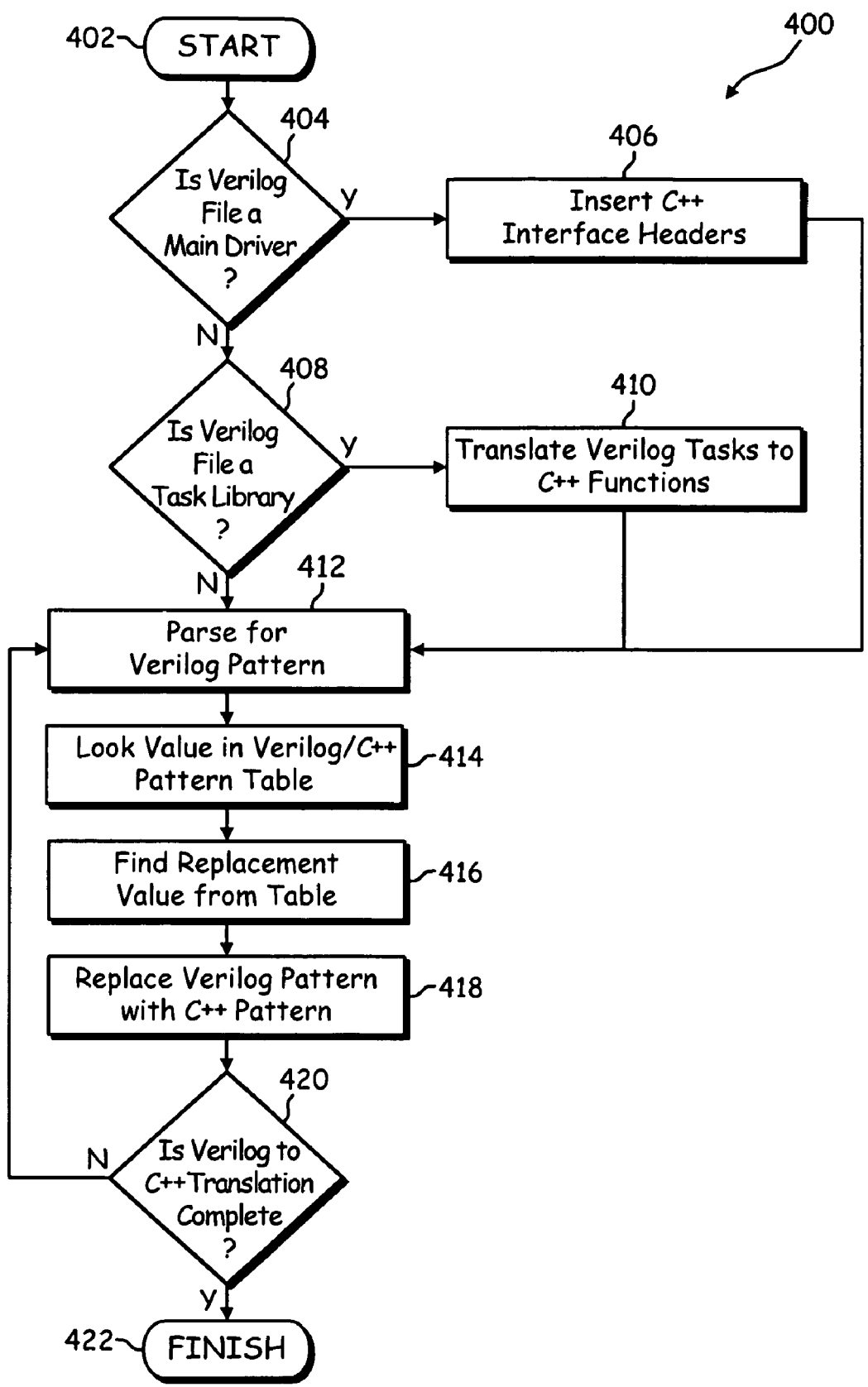
FIG. 4 is a flow diagram of an exemplary method for translating Verilog to C++, in accordance with an embodiment of the present invention.

Referring now to FIG. 4, there is illustrated a flow diagram of an exemplary method 400 for translating Verilog to C++, in accordance with an embodiment of the present invention. The exemplary steps may start at 402. At 404 it is ascertained whether the Verilog file for translation is a Main Driver. If the Verilog file is a Main Driver, then at 406, C++ interface headers are inserted. If the Verilog file is not a Main Driver, then 408 it is ascertained whether the Verilog file is a Task Library. If the Verilog file is a Task Library, then at 410 the Verilog tasks may be translated into C++ functions.

At 412, the Verilog file may be parsed for a Verilog pattern. For example, the Verilog file may be parsed for patterns from the table on FIG. 3. In accordance with an embodiment of the present invention, a Verilog to C++ translator may utilize a Verilog parser for parsing and translating the parsed statement into a C++ structure. In other embodiments of the present invention, a full-fledged parser translator could also be used for translating a Verilog source file to a C++ source file.

After a specific pattern is parsed at 412, at 414 the Verilog pattern may be located on a Verilog/C++ reference table, such as the reference table illustrated on FIG. 3. At 416, a corresponding C++ value may be obtained from the Verilog/C++ reference table. At 418, the Verilog pattern in the Verilog file is replaced with the obtained C++ corresponding value. At 420, it is ascertained whether the Verilog to C++ translation is complete. If the translation is not complete, then a subsequent Verilog pattern may be parsed at 412. If the Verilog to C++ translation is complete, then the exemplary steps of method 400 end at 422.

Figure 5:
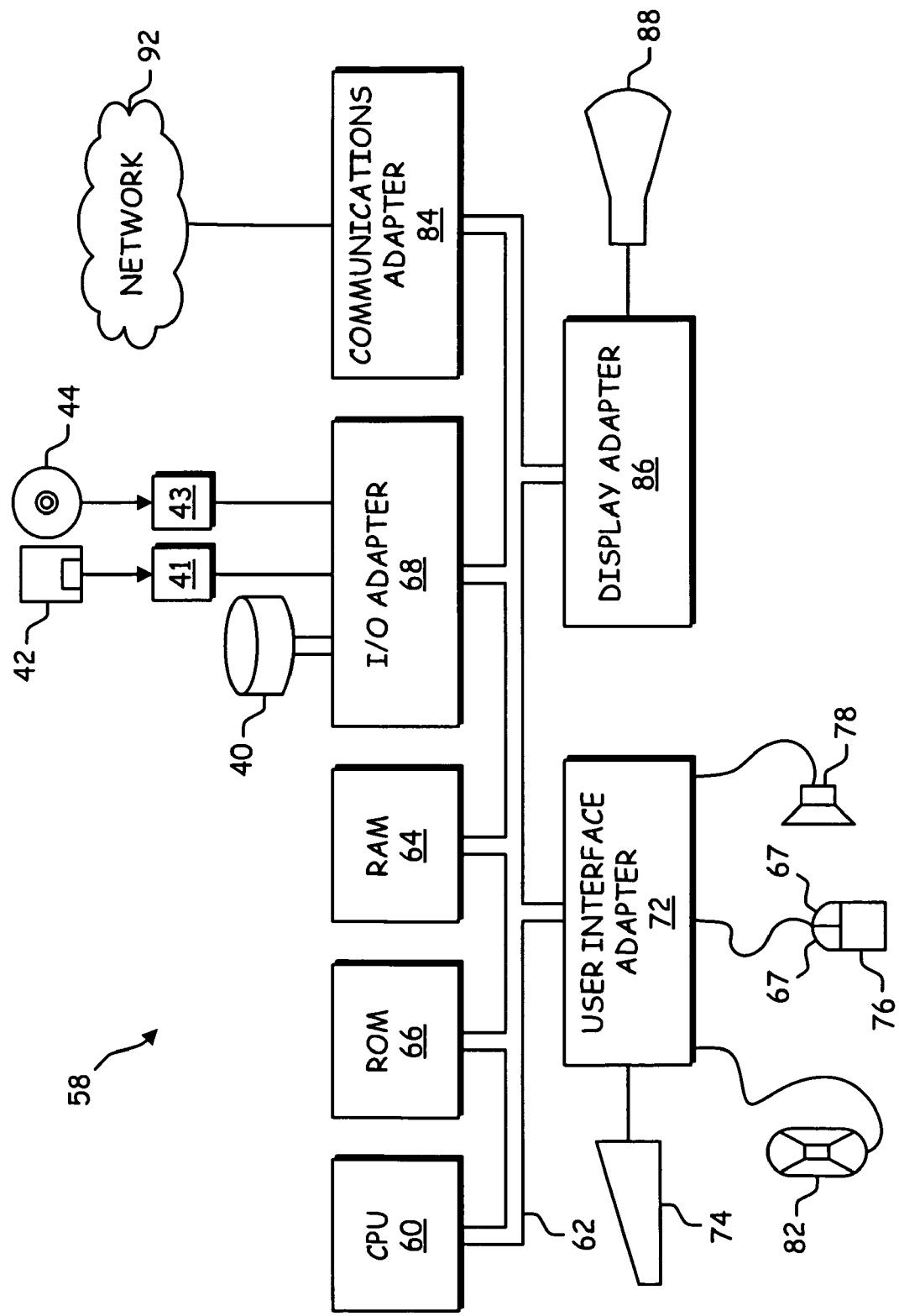
FIG. 5 is an exemplary hardware environment wherein the present invention may be practiced.

Referring now to FIG. 5, a representative hardware environment for a computer system 58 for practicing the present invention is depicted. A CPU 60 is interconnected via system bus 62 to random access memory (RAM) 64, read only memory (ROM) 66, an input/output (I/O) adapter 68, a user interface adapter 72, a communications adapter 84, and a display adapter 86. The input/output (I/O) adapter 68 connects peripheral devices such as hard disc drives 40, floppy disc drives 41 for reading removable floppy discs 42, and optical disc drives 43 for reading removable optical disc 44

(such as a compact disc or a digital versatile disc) to the bus 62. The user interface adapter 72 connects devices such as a keyboard 74, a mouse 76 having a plurality of buttons 67, a speaker 78, a microphone 82, and/or other user interfaces devices such as a touch screen device (not shown) to the bus 62. The communications adapter 84 connects the computer system to a data processing network 92. The display adapter 86 connects a monitor 88 to the bus 62.

An embodiment of the present invention can be implemented as a file resident in the random access memory 64 of one or more computer systems 58 configured generally as described in FIG. 5. Until required by the computer system 58, the file may be stored in another computer readable memory, for example in a hard disc drive 40, or in removable memory such as an optical disc 44 for eventual use in an optical disc drive 43, or a floppy disc 42 for eventual use in a floppy disc drive 41. The file can contain a plurality of instructions executable by the computer system, causing the computer system to perform various tasks, such effectuating the flow chart described in FIG. 4.

One skilled in the art would appreciate that the physical storage of the sets of instructions physically changes the medium upon which it is stored electrically, magnetically, or chemically so that the medium carries computer readable information.

Accordingly, the present invention may be realized in hardware, software, or a combination of hardware and software. The present invention may be realized in a centralized fashion in at least one computer system, or in a distributed fashion where different elements are spread across several interconnected computer systems. Any kind of computer system or other apparatus adapted for carrying out the methods described herein is suited. A typical combination of hardware and software may be a general-purpose computer system with a computer program that, when being loaded and executed, controls the computer system such that it carries out the methods described herein.

The present invention may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. A method for translating a hardware structure design language into a general purpose programming language, the method comprising:

searching for a hardware structure design language pattern in a hardware structure design language file, the hardware structure design language pattern associated with a specific functionality; and substituting the a hardware structure design language pattern with a general purpose programming language expression, wherein the a general purpose programming language expression is associated with the specific functionality;

if the hardware structure design language file comprises a task library:

identifying a hardware structure design language task within the task library; and translating the hardware structure design language task into a general purpose programming language function; and if the hardware structure design language file comprises a main driver:

inserting in the hardware structure design language file at least one general purpose programming language interface header.

2. The method of claim 1, wherein the translating from the hardware structure design language into the general purpose programming language utilizes macro functions in Script.

3. The method of claim 2, further comprising identifying whether the hardware structure design language file comprises at least one of a task library, a main driver, and a driver module.

4. The method of claim 1, wherein the hardware structure design language pattern comprises # delay statements from the hardware structure design language file.

5. The method of claim 1, wherein the hardware structure design language pattern comprises ifdef statements in the hardware structure design language file.

6. The method of claim 1, wherein the hardware structure design language pattern comprises symbols from the hardware structure design language file.

7. The method of claim 1, wherein the a hardware structure design language pattern comprises a begin keyword in the hardware structure design language file to a "{" symbol.

8. The method of claim 1, wherein the hardware structure design language pattern comprises an end keyword in the hardware structure design language file to a "}" symbol.

9. The method of claim 1, wherein the hardware structure design language pattern comprises at least one register definition in the hardware structure design language file into at least one general purpose programming language definition.

10. The method of claim 1, wherein the hardware structure design language pattern comprises at least one combinatorial assignment in the hardware structure design language file.

11. The method of claim 1, wherein the hardware structure design language pattern comprises at least one event in the hardware structure design language file into at least one general purpose programming language event.

12. The method of claim 1, wherein the hardware structure design language pattern comprises at least one hardware structure design language switch in the hardware structure design language file into at least one general purpose programming language switch.

13. The method of claim 1, wherein the hardware structure design language pattern comprises at least one hardware structure design language concat expressions in the a hardware structure design language file into at least one general purpose programming language concat expressions.

14. The method of claim 1, wherein the hardware structure design language pattern comprises at least one hardware structure design language parameter in the hardware structure design language file into at least one general purpose programming language #define.

15. The method of claim 1, wherein the hardware structure design language pattern comprises at least one hardware structure design language const in the hardware structure design language file into at least one general purpose programming language const.

16. The method of claim 1, wherein the hardware structure design language pattern comprises at least one hardware structure design language bit access macro in the hardware structure design language file into at least one general purpose programming language functional equivalent.

17. A machine-readable storage having stored thereon, a computer program having at least one code section for translating a hardware structure design language to a general purpose programming language, at least one code section being executable by a machine for causing the machine to perform steps comprising:

searching for hardware structure design language pattern in a hardware structure design language file, the hardware structure design language pattern associated with a specific functionality; and substituting the hardware structure design language pattern with a general purpose programming language expression, wherein the general purpose programming language expression is associated with the specific functionality; and if the hardware structure design language file comprises a task library:
code for identifying a hardware structure design language task within the task library; and
code for translating the hardware structure design language task into the general purpose programming language function; and if the hardware structure design language file comprises a main driver:
code for inserting in the hardware structure design language file at least one general purpose programming language interface header.

18. The machine-readable storage according to claim 17, wherein the translating from the hardware structure design language into the general purpose programming language utilizes macro functions in Script.

19. The machine-readable storage according to claim 18, further comprising code for identifying whether the hardware structure design language file comprises at least one of a task library, a main driver, and a driver module.

20. The machine-readable storage according to claim 19, further comprising code for removing # delay statements from the hardware structure design language file.

21. The machine-readable storage according to claim 19, further comprising code for translating ifdef statements in the hardware structure design language file.

22. The machine-readable storage according to claim 19, further comprising code for removing symbols from the hardware structure design language file.

23. The machine-readable storage according to claim 19, further comprising code for converting a begin keyword in the hardware structure design language file to a "{" symbol.

24. The machine-readable storage according to claim 19, further comprising code for converting an end keyword in the hardware structure design language file to a "}" symbol.

25. The machine-readable storage according to claim 19, further comprising code for converting at least one register definition in the hardware structure design language file into at least one general purpose programming language definition.

26. The machine-readable storage according to claim 19, further comprising code for performing at least one combinatorial assignment in the hardware structure design language file.

27. The machine-readable storage according to claim 19, further comprising code for converting at least one event in the hardware structure design language file into at least one general purpose programming language event.

28. The machine-readable storage according to claim 19, further comprising code for converting at least one hardware structure design language switch in the hardware structure design language file into at least one general purpose programming language switch.

29. The machine-readable storage according to claim 19, further comprising code for converting at least one hardware structure design language concat expressions in the hardware structure design language file into at least one general purpose programming language concat expressions.

30. The machine-readable storage according to claim 19, further comprising code for converting at least one hardware structure design language parameter in the hardware structure design language file into at least one general purpose programming language #define.

31. The machine-readable storage according to claim 19, further comprising code for converting at least one hardware structure design language const in the hardware structure design language file into at least one general purpose programming language const.

32. The machine-readable storage according to claim 19, further comprising code for converting at least one hardware structure design language bit access macro in the hardware structure design language file into at least one general purpose programming language functional equivalent.

* * * * *